(12) United States Patent
Lane et al.

(10) Patent No.: US 8,357,985 B2
(45) Date of Patent: Jan. 22, 2013

(54) BIPOLAR TRANSISTOR WITH GUARD REGION

(75) Inventors: William Allan Lane, Cork (IE); Andrew David Bain, Limerick (IE); Derek Frederick Bowers, Los Altos Hills, CA (US); Paul Malachy Daly, Limerick (IE); Anne Maria Deignan, Limerick (IE); Michael Thomas Dunbar, San Jose, CA (US); Patrick Martin McGuinness, Limerick (IE); Bernard Patrick Stenson, Limerick (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 13/350,582

(22) Filed: Jan. 13, 2012

(65) Prior Publication Data
US 2012/0112307 A1  May 10, 2012

Related U.S. Application Data

(63) Continuation of application No. 12/611,074, filed on Nov. 2, 2009.

(51) Int. Cl.
*H01L 29/02* (2006.01)
(52) U.S. Cl. ........ 257/488; 257/490; 257/491; 257/495; 257/592; 257/593; 257/E27.053; 257/E29.009; 257/E29.185; 438/353; 438/356
(58) Field of Classification Search .................. 257/488, 257/491, 495, 592, 593, E27.053, E29.185, 257/490, E29.009; 438/353, 356
See application file for complete search history.

(56) References Cited

U.S. PATENT DOCUMENTS

| | | | | |
|---|---|---|---|---|
| 3,772,577 | A * | 11/1973 | Planey | 257/496 |
| 5,187,562 | A * | 2/1993 | Becker | 257/539 |
| 5,247,201 | A | 9/1993 | Becker | |
| 5,327,006 | A | 7/1994 | Beasom | |
| 5,629,552 | A * | 5/1997 | Zommer | 257/490 |
| 5,668,397 | A | 9/1997 | Davis et al. | |
| 5,939,759 | A | 8/1999 | Arnborg | |
| 6,936,893 | B2 * | 8/2005 | Tanaka et al. | 257/341 |
| 2007/0272979 | A1 * | 11/2007 | Saito et al. | 257/335 |
| 2010/0013458 | A1 | 1/2010 | Lany et al. | |

FOREIGN PATENT DOCUMENTS

| | | |
|---|---|---|
| DE | 1614749 | 12/1970 |
| EP | 0553589 | 8/1993 |
| JP | 61278161 | 12/1986 |
| JP | 61285764 A * | 12/1986 |
| JP | 3110852 | 5/1991 |

OTHER PUBLICATIONS

Kosier, S. L. et al., "Comparison of termination methods for low-voltage, vertical integrated power devices", Solid State Electronics, Elsevier Science Publishers, Barking, GB, vol. 37, No. 9, Sep. 1, 1994, pp. 1611-1617.
International Search Report and Written Opinion dated Mar. 11, 2011 for PCT/US2010/055000, 12 pages.
Written Opinion of the International Preliminary Examining Authority for PCT/US2010/055000 dated Jan. 25, 2012, 5 pages.

* cited by examiner

*Primary Examiner* — Tu-Tu Ho
(74) *Attorney, Agent, or Firm* — Knobbe, Martens, Olson & Bear, LLP

(57) ABSTRACT

A bipolar transistor comprising an emitter region, a base region and a collector region, and a guard region spaced from and surrounding the base. The guard region can be formed in the same steps that form the base, and can serve to spread out the depletion layer in operation.

20 Claims, 11 Drawing Sheets

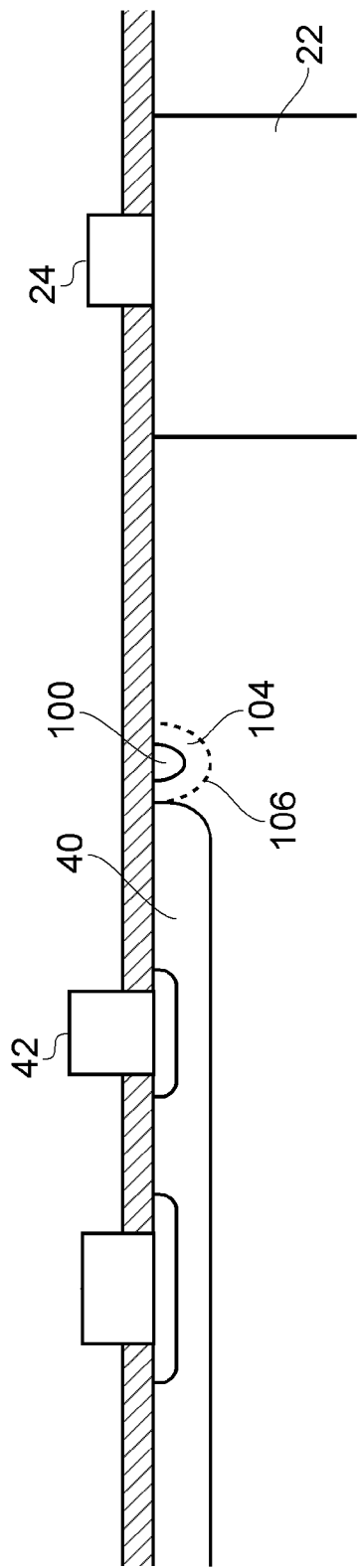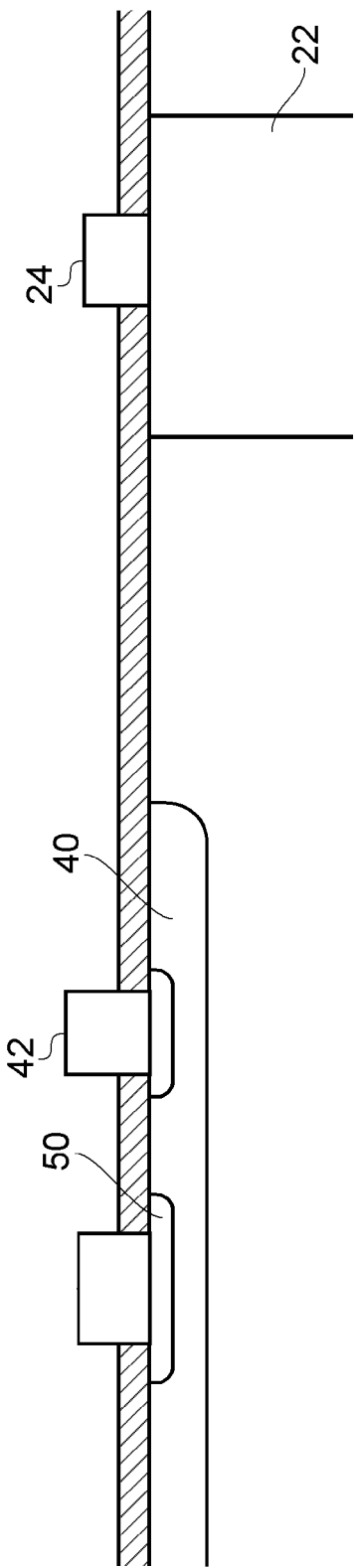

Prior Art

BIPOLAR TRANSISTOR WITH GUARD REGION

CROSS REFERENCE TO RELATED CASE

This application is a continuation of U.S. application Ser. No. 12/611,074, filed Nov. 2, 2009, titled "Bipolar Transistor," the entire disclosure of which is hereby incorporated herein by reference.

FIELD OF THE INVENTION

The present invention relates generally to transistors, and more specifically, to bipolar transistors and structures therein which improve their breakdown voltage.

BACKGROUND OF THE INVENTION

A semiconductor material has a maximum field strength that it can withstand before the field starts ripping electrons from atoms, thereby causing breakdown in which the material becomes conducting, possibly causing permanent damage.

The fabrication of doped regions to form a semiconductor device varies the way field gradients occur within the material, and can vary breakdown voltages.

It is highly desirable to reduce the reduction in breakdown voltage that occurs.

SUMMARY OF THE INVENTION

According to one aspect of the present invention, a bipolar transistor is provided comprising an emitter region, a base region and a collector region, and a guard region surrounding the base.

According to another aspect of the present invention, a method is provided for manufacturing a bipolar transistor, including forming an emitter region, a base region and a collector region, and forming a guard region surrounding the base region.

It is thus possible to modify the electric field profiles within a transistor so as to increase the voltage at which it breaks down.

In some embodiments, a conducting layer may be placed above and extend over and beyond the guard region. This gives rise to the possibility of extending a depletion region adjacent the guard region so as to reduce electric field gradients near the guard region. In some embodiments the guard and base regions can be simultaneously doped.

BRIEF DESCRIPTION OF THE DRAWINGS

The present invention will further be described, by way of example only, with reference to the accompanying drawings, in which:

FIG. 4 is a representation of modeled electric field gradients within the transistor shown in FIG. 1 at the onset of breakdown when the transistor had been on, i.e., conducting;

FIG. 5 is a representation of the transistor of FIG. 4 when the transistor is on and with a collector-to-base voltage just a few volts less in magnitude than that required to initiate breakdown;

DETAILED DESCRIPTION OF PREFERRED EMBODIMENTS

The following detailed description is directed to certain specific embodiments of the invention. However, the invention can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Relative terms such as "above," "below" and so on as used herein refer to components as orientated in the attached figures, and should be construed accordingly.

Figure 1:
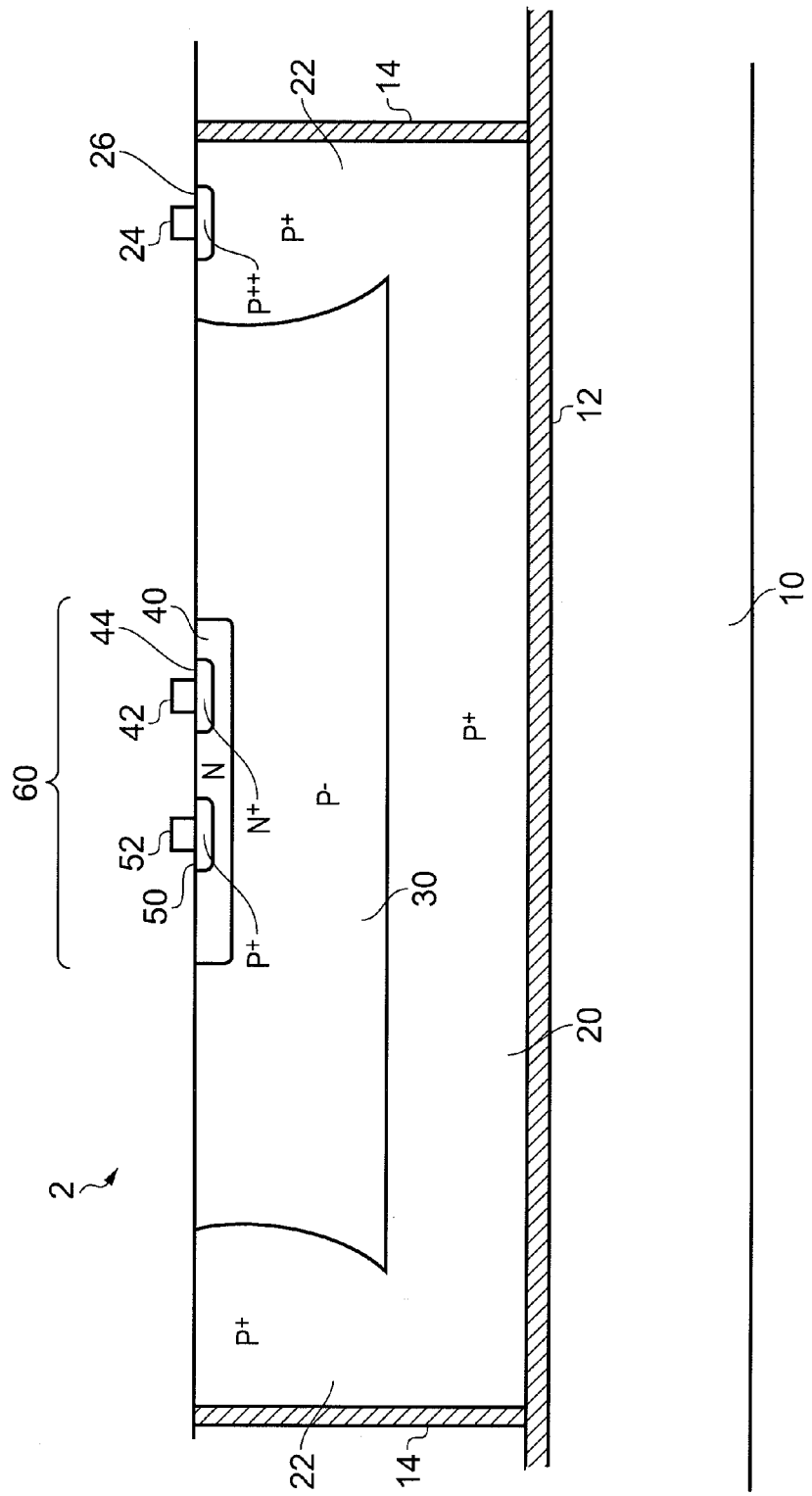
FIG. 1 is a schematic cross-sectional representation of a prior art vertically fabricated PNP bipolar transistor.

FIG. 1 illustrates the layout of a typical bipolar transistor. For example, the transistor may be a PNP transistor. A skilled artisan will appreciate that the teachings disclosed herein also apply to NPN bipolar transistors.

The arrangement shown in FIG. 1 is a vertically fabricated PNP transistor. The transistor 2 is formed above a substrate 10, which can be a semiconductor carrier wafer. The substrate 10 may carry large numbers of transistors, which should be isolated from one another. This, as is known to the person skilled in the art, can be achieved by providing a well of doped semiconductor and forming a reverse biased junction. However newer technologies such as silicon on insulator (SOI) fabrication exist where individual devices can be built above an insulating layer 12, which may comprise silicon dioxide, and enclosed by side walls 14, which may also comprise silicon dioxide. The transistor 2 comprises a P-type layer 20 which acts as the collector of the bipolar transistor. If the device was offered as a separate component the layers 10 and 12 could have been omitted and the P-type layer 20 could have a bondpad attached to its lower surface. However, when the transistor 2 is fabricated in an integrated circuit then the P-type layer 20 is connected to the upper surface of the device by the P-type regions 22. The P-type layer 20 and the P-type regions 22 may be relatively heavily doped, and in some nomenclatures may be described as P+ where the "+" denotes heavy or enhanced doping levels. A metal contact 24 makes current flow connection at a surface of the P-type region(s) 22 to form a collector terminal. As the current density near the contact 24 is quite high, a region of very highly doped P type semiconductor 26 may be provided to reduce contact resistance.

Above the P-type layer 20 is a less heavily doped P-type region 30. This is sometimes designated as P− where the "−" sign indicates light or reduced doping intensity. Typically the doping concentration is between 100 and 1000 times less than in the P-type layer 20, but values outside of this range are possible. Above the P-type region 30 is an N-type region 40, which forms the base of the transistor 2. An island of P-type region 50 is formed within the N-type region 40, and forms the emitter of the device. A metal contact 42 is provided above the base region 40 to act as the base terminal, and a region 44 of enhanced N-type doping may be provided below the base terminal to facilitate current flow by offering a lower contact impedance.

The person skilled in the art often describes the transistor as having an intrinsic part and an extrinsic part. The intrinsic part is located beneath the base region, and generally in the region designated 60. The extrinsic part is the remainder of the device.

As is well known to the person skilled in the art, when P-type and N-type semiconductor materials are in contact, the holes in the P-type material tend to diffuse into the N-type material, and the electrons in the N-type material tend to diffuse into the P-type material. The diffusion upsets charge neutrality and creates an electrostatic potential at the junction, which in turn creates a region where most of the carriers have been removed, known as a depletion layer. The depletion layer has higher resistivity than the surrounding semiconductor so the strongest electric fields within a transistor occur at or near the boundaries of dissimilar semiconductor types.

As previously noted, process parameters effect the breakdown voltage. Such parameters include doping concentrations, and the distances that dopants penetrate the semiconductor material. A process that, for example, is used to produce devices suitable for working at a nominal voltage, such as a 36 V process, may result in transistors having a breakdown voltage roughly twice the nominal operating voltage, such as around 70 V.

Up to this point, breakdown has been discussed as if it is a single process, but in fact breakdown can occur in different ways and under different operating conditions. A device may for example be "on," passing a current between the collector and emitter, and breakdown in this operating mode can be due to different mechanisms than those that cause the device to breakdown when it is non-conducting ("off").

Figure 2:
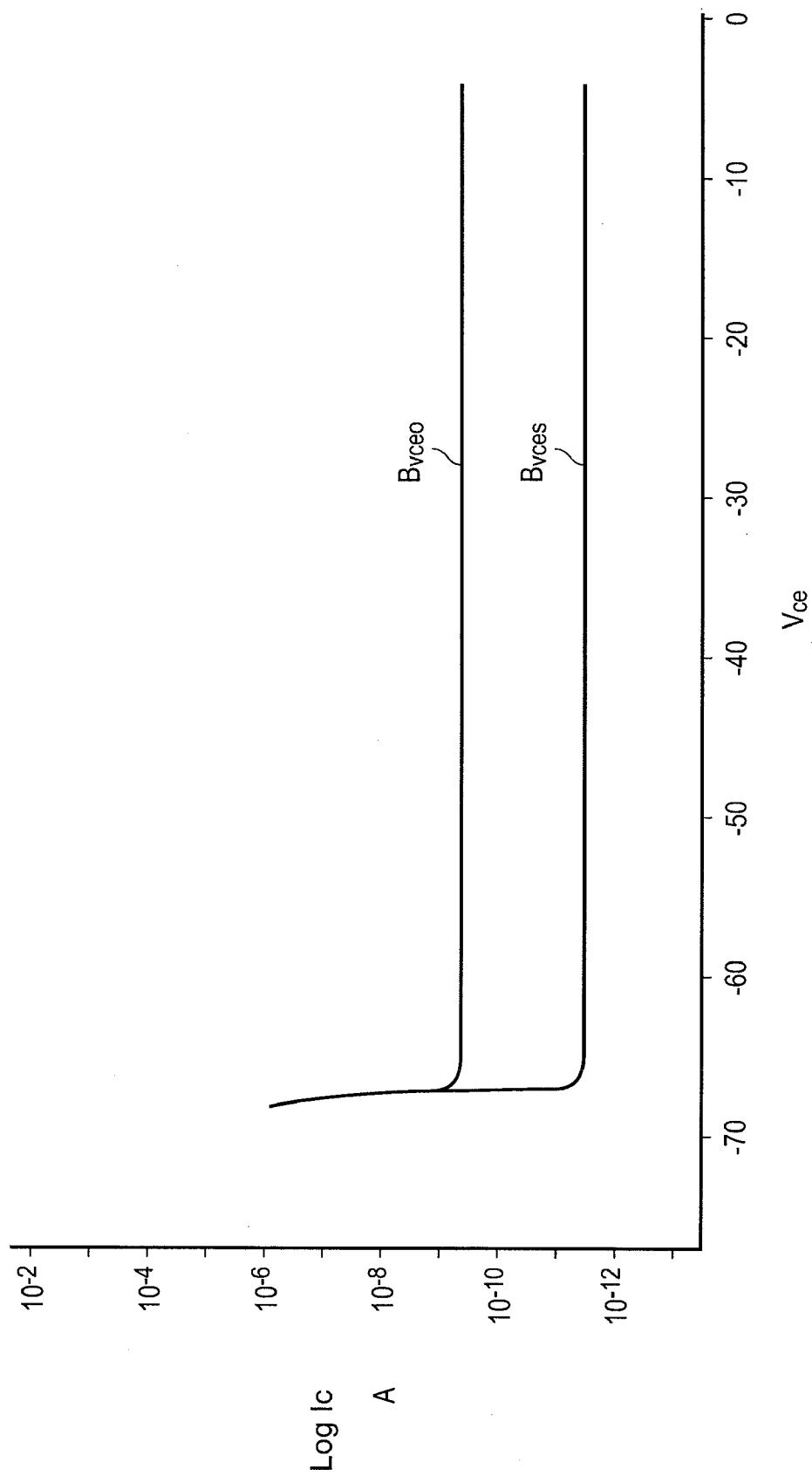
FIG. 2 is a logarithmic plot of collector current versus collector voltage for different operating conditions of a transistor, and showing the result of breakdown.

FIG. 2 shows measurements of breakdown current for an exemplary PNP transistor under test as the voltage difference between its collector and emitter terminals was varied from 0 to nearly −70 volts.

For the measurement "Bvces" the device was off, with the base being held at 0V, along with the emitter. The collector voltage was swept from zero volts and became increasingly negative.

For the measurement "Bvceo" the device was on, nominally with the base open, but in practice with a current sink controlling the base current at a very small predetermined value.

It can be seen that in the test device both breakdown voltages are the same. This is indicative of the same phenomenon being implicated in both breakdown events.

The inventors investigated further and built computer simulations of the transistor.

Figure 3:
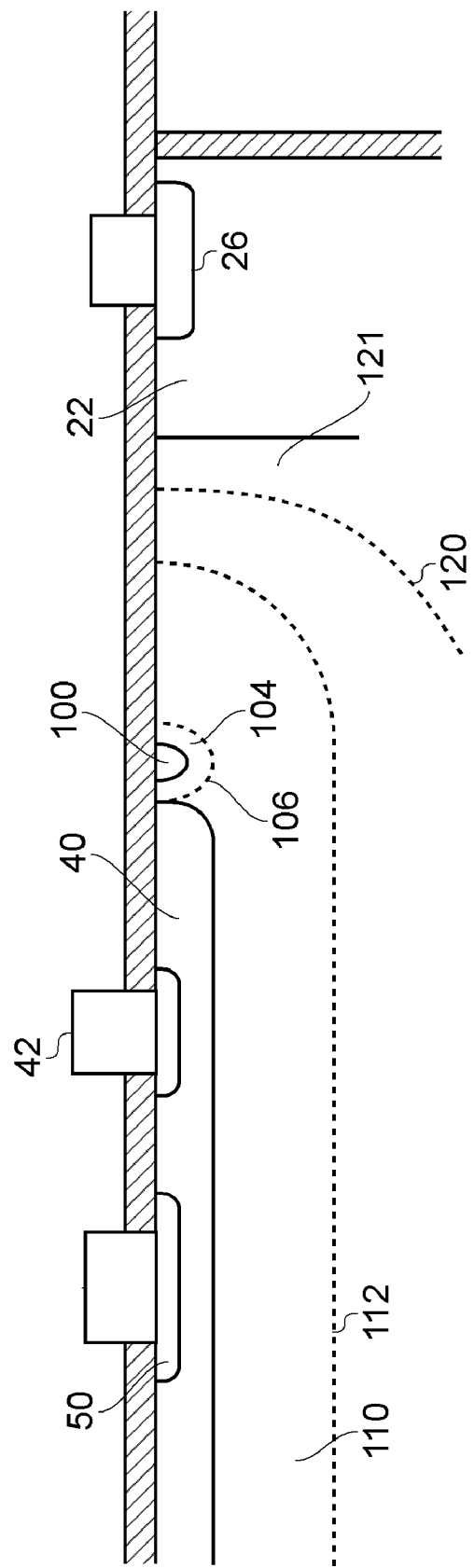
FIG. 3 is a representation of modified electric field gradients within the transistor shown in FIG. 1 at the onset of breakdown when the transistor had been notionally non-conducting.

FIG. 3 illustrates a portion of the transistor shown in FIG. 1 in greater detail, and specifically focuses on the region near the surface of the device that includes the emitter, base and collector regions. As well as showing nominal device structure, it also shows electric field gradients.

Although the device structures, such as the base and the collector have been shown as being well defined, it should be appreciated that during fabrication the ion implantation process on other doping process typically occurs from above the surface of the device so dopant concentrations are typically greater near the surface and naturally decrease with increasing depth into the wafer. Following implantation, a diffusion step is performed where the wafer is heated. This allows dopants to spread, helping smear out local discontinuities in dopant concentration. However, diffusion occurs in all directions so the notionally sharp delineation between the base region and P-type region 30 of FIG. 1 becomes a smoother change in concentration and hence the transistor does not have a sharp boundary between these regions.

It should also be noted that higher dopant concentrations near a junction between dissimilarly doped materials means that the depletion region is smaller and hence any voltage difference between the dissimilar regions is dropped across a smaller distance, and hence the electrostatic field gradient is higher.

Given that implantation generally occurs from above, it follows that the highest field gradients tend to be near the surface of the transistor, even after the thermal diffusion step has occurred.

Additionally, it is known from electrostatic theory that the field gradient increases around a curved surface. The formation of the base layer gives rise to a structure having a nominally flat lower surface (which can be regarded as part of a cylinder of infinite radius) with curved edges, which can be regarded as a cylinder with a radius that is similar to the diffusion distance. Thus the curvature at the edge of the base region gives rise to a field strength enhancement.

FIG. 3 shows a small portion of the device representing the first portion to suffer breakdown occurring at a region 100 adjacent the edge of the base region 40. This interface marks the interface between the base region 40 and the collector, known as the base-collector junction, where the field gradient may exceed $5 \times 10^5$ volts per meter. The region 104 enclosed by broken line 106 has a field gradient that may be greater than $4 \times 10^5$ volts per meter. The region 110 bounded by broken line 112 has a field gradient that may be between $3 \times 10^5$ and $4 \times 10^5$ volts per meter.

FIG. 3 also shows the edge 120 of the depletion region 121 around the collector structure. The depletion region 121 has extended towards the base region 40. Thus, the distance over which the base-to-collector voltage difference is dropped is reduced, again prompting an increase in localized field gradients. The high field gradient provokes an avalanche breakdown in region 100, with carriers (in this case electrons), being swept towards and injected into the base region 40. These carriers act like a signal to turn the device on, and if the current flow in the device is not limited by an external factor, the collector current will increase until the device becomes damaged.

FIG. 4 is similar to FIG. 3, but shows the simulated field gradients inside the device when the base is passing a control current. As with FIG. 3, breakdown occurs with the generation of a region 100 of high field potential near the surface of the device at the base-collector junction.

Simulations also show, as shown in FIG. 5, that when the device is on but just a few volts below the onset of breakdown the extremely high field gradient, i.e., region 100, at the corner of the base region is missing.

In accordance with preferred embodiments, the creation of the extremely high field gradients at the corner of the base region can be reduced by the fabrication of additional structures within the bipolar transistor.

Figure 6:
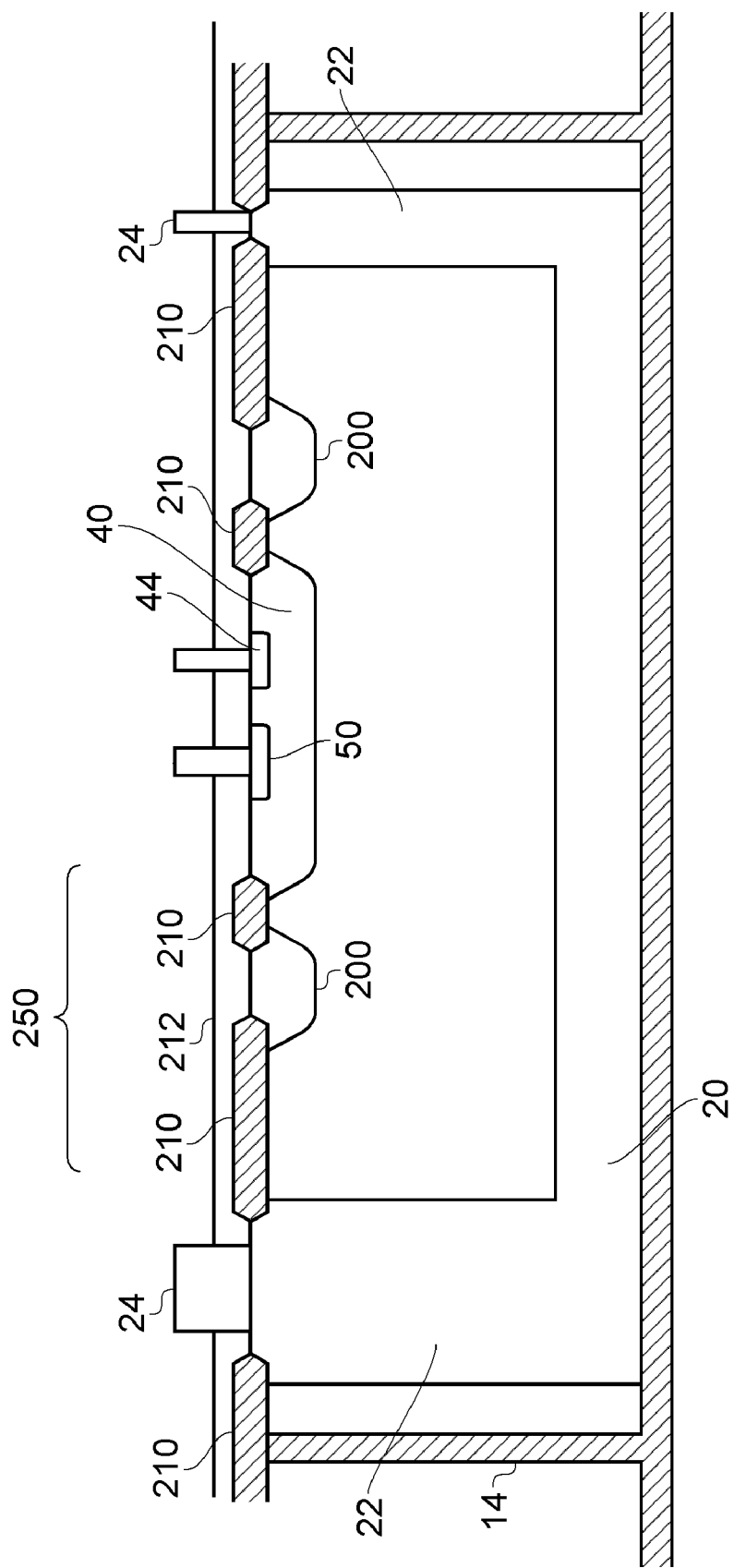
FIG. 6 shows, in schematic cross section, a transistor in accordance with a first embodiment of the invention.

As shown in FIG. 6, a guard region 200 is fabricated in the surface region of the device surrounding the base region 40. The guard region 200, when viewed from above the transistor, encircles the base region 40 and hence can also be called a guard ring. However, "ring" in this context only denotes a closed loop structure, and does not necessarily imply a circular shape. For example, rectangular loops can be used. Also shown is a field isolation layer 210 which is commonly fabricated at the surface of the semiconductor, as is well known to the person skilled in the art. In the illustrated embodiment, part of the field isolation layer 210 insulates the base region 40 from the guard region 200. A final passivating or insulating layer, e.g., of silicon dioxide, is then deposited over the surface of the device, with only the metal contacts extending through it. Such isolation is a standard feature in device fabrication and need not be described further.

As in FIG. 1, the collector region 20 and emitter region 50 of FIG. 6 are both doped to be P-type semiconductor material. Also like FIG. 1, the base region 40 and guard region 200 of FIG. 6 are doped to be N-type semiconductor material. Thus, the collector 20 and emitter 50 have one type of conductivity, while the base region 40 and the guard region 200 have another, opposite type of conductivity. One of skill in the art will appreciate that in other embodiments the dopant types may be switched, i.e., the base region 40 and the guard region 200 may be doped to be P-type semiconductor material and the collector region 20 and emitter region 50 may be doped to be N-type semiconductor material.

Forming both the guard layer 200 and base region 40 from material of the same conductivity type can be advantageous. The guard region 200 can be advantageously implanted at the same time as the base region 40. Consequently forming the guard region 200 does not incur any extra processing steps and can be formed using the same doping mask as for the base region 40. Accordingly, the guard layer 200 and the base region 40 have the same type of conductivity, and will also have the same maximum concentration of dopant within those regions, although the different geometries may lead to slightly different extents of diffusion. The guard region 200 has the effect of widening the space charge region around the edge of the PN junction formed between the base 40 and collector 20. Additionally, the guard region 200 is not connected to any contacts. This allows it to float to a voltage which is intermediate the base voltage and the collector voltage.

This in turn means that the field gradients are reduced because the base-collector voltage is dropped over a larger distance within the transistor.

In the absence of a guard region, the depletion layer would extend from the base-collector by a distance, d, at a voltage just less than the voltage required to cause breakdown to occur. When the guard region 200 is implanted it can be positioned such that, in the finished transistor, the edge of the guard region 200 is spaced from the base-collector junction by less than the distance, d.

In some embodiments, a further intermediate region may be included between the base region 40 and the collector region 20. In FIG. 6, this intermediate region is a less heavily doped P-type region 30. The doping concentration of P-type region 30 typically ranges from less heavily doped than the collector region 20 to not doped at all, otherwise referred to as intrinsic semiconductor.

Figure 7:
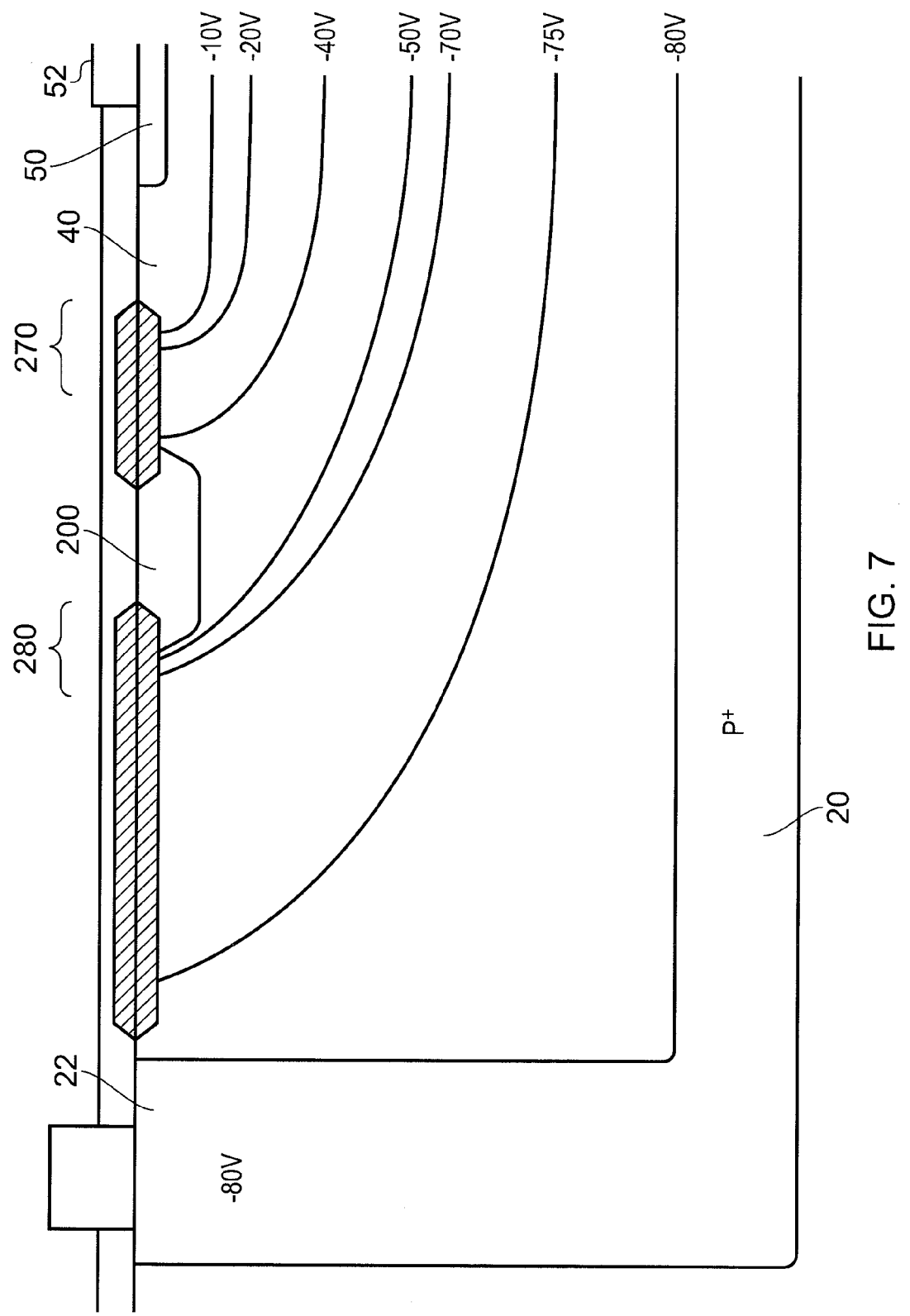
FIG. 7 shows a representation of modeled electric field gradients in the transistor of FIG. 6 with the collector held at −80 volts with respect to the base junction.

FIG. 7 shows the lateral region 250 of the device of FIG. 6 in greater detail. FIG. 7 also shows lines of equipotential within the device for a base 40 and emitter 50 held at 0 V and a collector held at −80 V.

In this example, the guard region 200 has been formed such that it floats to a voltage approximately half way between the base and the collector voltages. In so doing it reduces the field gradient at the edge of the base region 40. This means that a higher voltage can be applied between the collector 20 and the base 40 before the field gradient becomes sufficiently big to cause avalanche breakdown to occur. The inclusion of the guard region 200 modifies the potential gradients within the transistor 2. Lines of equipotential, and their voltage, are schematically included within FIG. 7. The edge of the base region 40 still experiences quite high field gradients at the surface of the transistor in the region 270 compared to the gradient around other portions of the base region 40. However, the field gradient is significantly reduced and consequently the field gradients do not induce impact ionization driven breakdown processes, even though in this example the collector voltage is at −80 Volts which for the identical device but omitting the guard region (as shown in FIG. 3) exceeds the breakdown voltage, as shown in FIG. 2.

It can be seen that a second zone of voltage drop occurs at the surface of the device in a region designated 280 at an edge facing towards the region 22 of P-type material that electrically connects and brings the collector layer 20 to the surface of the device.

One way of considering the effect of the guard region 200 is to regard it as spreading the depletion layer out around the base 40, and effectively increasing its radius of curvature and thereby reducing curvature-enhanced field gradients.

Figure 8:
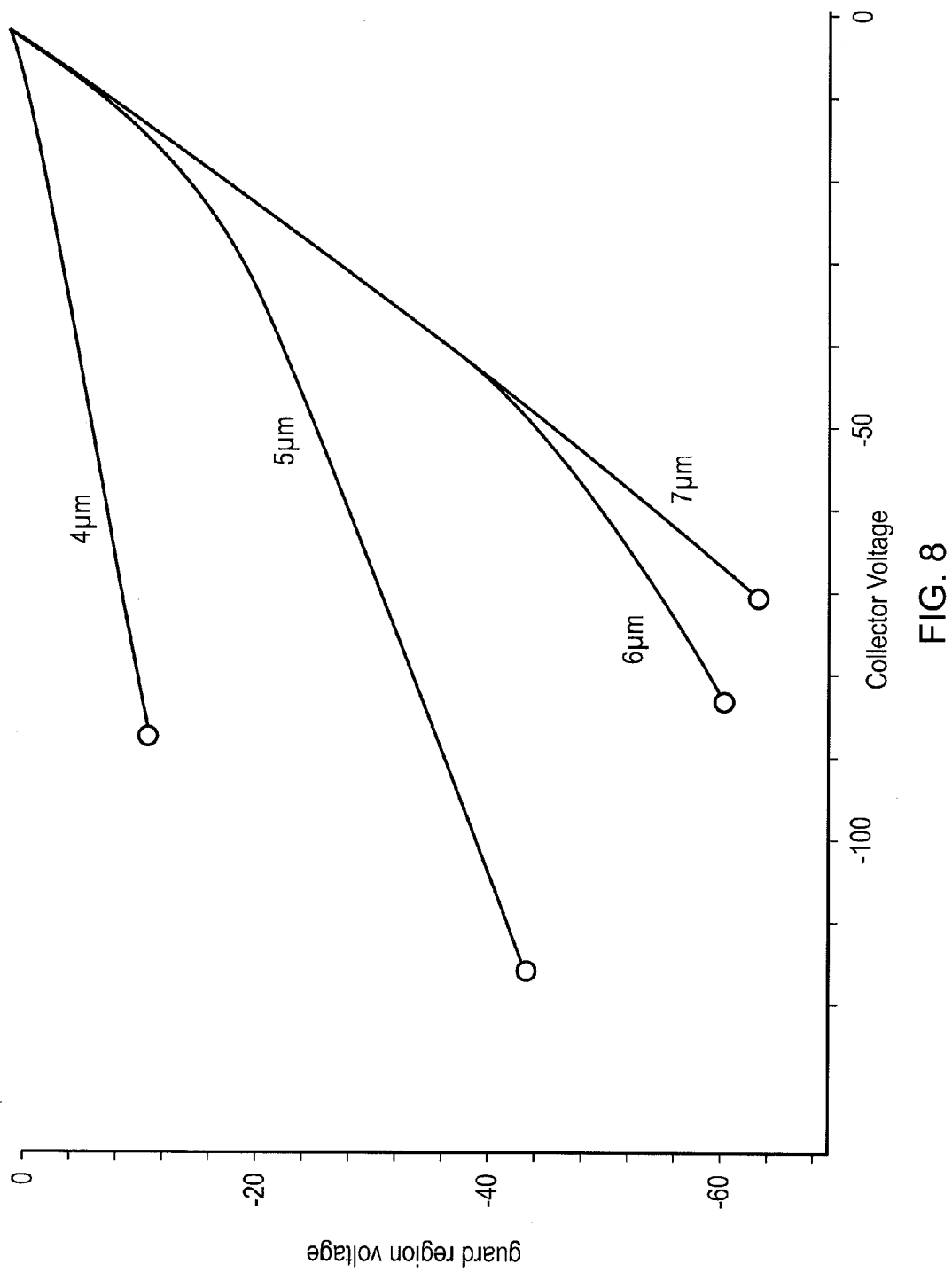
FIG. 8 is a graph showing guard ring voltage versus collector voltage for various guard ring-to-base separations.

The inventors investigated the effect of different separations between the guard region 200 and the base 40. The results of this investigation are shown in FIG. 8.

The effect of guard region separation from the base for separation distances (prior to thermal diffusion) of 4, 5, 6 and 7 micrometers (μm) were investigated. The guard region voltage was measured as the collector voltage was swept from zero volts to the device breakdown voltage. The guard region in the experiments was 3 μm wide and the separation distance is measured from the edge of the aperture in a mask defining where the base region is implanted to the nearest edge of the aperture in the mask defining where the guard region is implanted. The width of the guard ring is not particularly important provided that it is wide enough to be formed reliably.

It can be seen that when the guard region 200 is relatively close to the collector (smaller spacing, e.g., 4 μm), little of the collector voltage is transferred to the guard region, and consequently the field gradient at the edge of the base is not significantly reduced. Thus for the 4 μm guard region, when the collector is at −50 V the guard region is only at around −8 V, so the bulk of the base collector voltage is dropped in the remaining (>4 μm) distance between the guard region 200 and the base 40. As the guard region distance from the base is increased, the guard region floats to a greater proportion of the collector voltage so, for example at a collector voltage of −50 volts the 5 μm separated guard region is at around −30 V, whereas the 6 μm and 7 μm separated guard regions are at about −44 V. This would seem to suggest that for this device the guard region is preferably between 4 μm and 5 μm from the collector. However, the width of the guard region also has an effect on the operation of the device. The circles at the end of each line mark the onset of breakdown.

Figure 9:
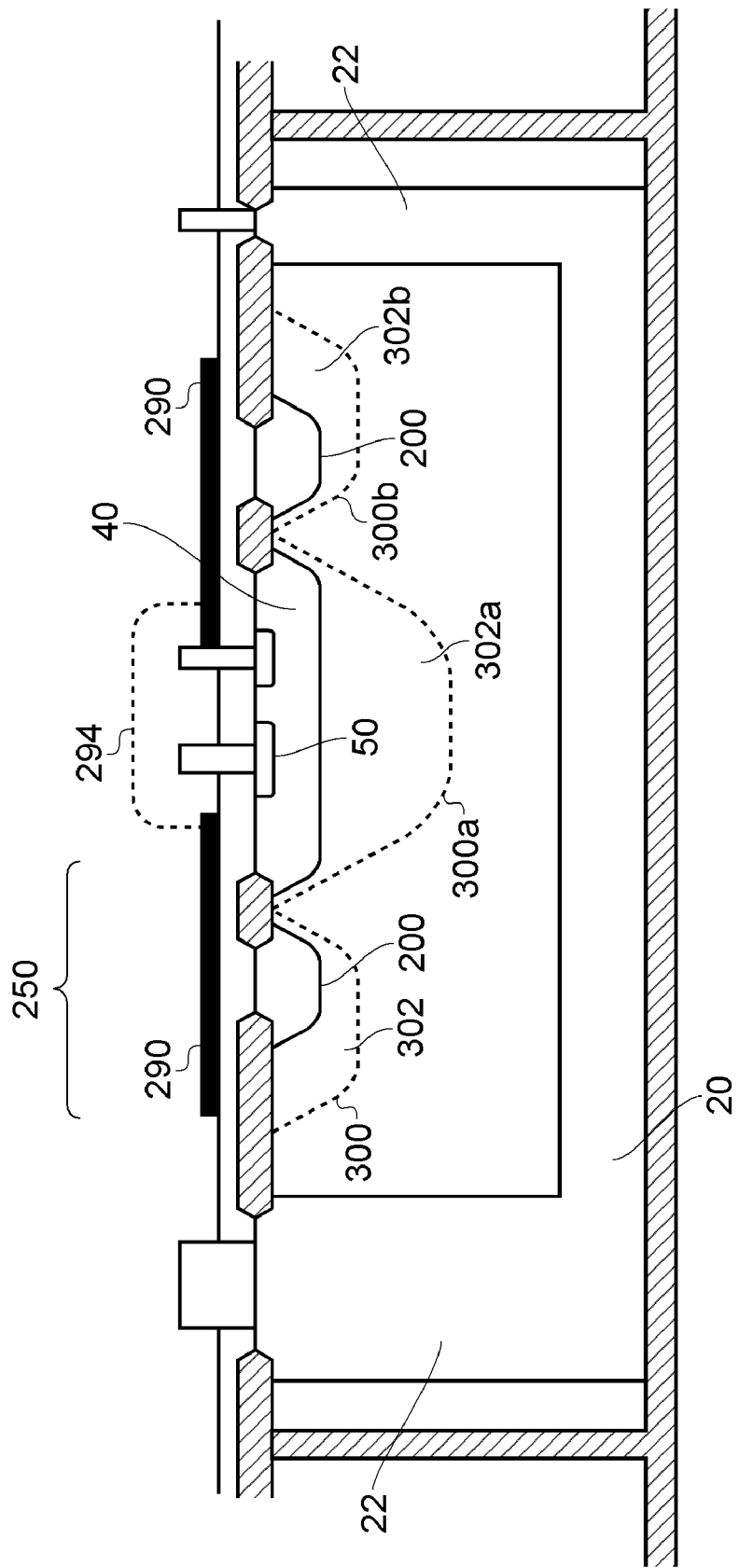
FIG. 9 shows, in schematic cross section, a transistor in accordance with a further embodiment of the invention, and also shows schematically an electric field contour within the transistor.

With reference to FIG. 9, in one embodiment, an enhancement to the breakdown voltage can be achieved by placing a metal conductor 290 over, but insulated from, the guard region an extending some of the distance from the guard region to the collector contact.

Such a metal layer, which can be regarded as a field plate, when connected to the base terminal causes the depletion of the N-type semiconductor around the guard region 200 to be extended laterally. This in turn reduces the radius of curvature of the depletion layer, which results in a further reduction of the electric field gradient at the edge of the guard region. This means that the guard region can be positioned such that it, in the absence of the conductor would have breakdown occurring at its edge facing towards the collector connection 22. The field plate then acts to reduce the field gradient at this edge by extending the depletion layer. This results in a further enhancement of the breakdown voltage.

FIG. 9 schematically illustrates electric field gradient reduction with lines 300, 300a and 300b, which delineate the boundaries of regions 302, 302a and 302b having electric field gradients of around, for example, $3 \times 10^5$ $Vm^{-1}$ from regions of lesser field gradient, for a device having a metallic field plate 290 which, although as appearing in cross-section to be two plates is in fact a single structure connecting together above and below the plane of the diagram such that it is at the same potential, as schematically designated by electrical connection 294. It will be understood that regions 302, 302b also represent a single annular region.

Figure 10:
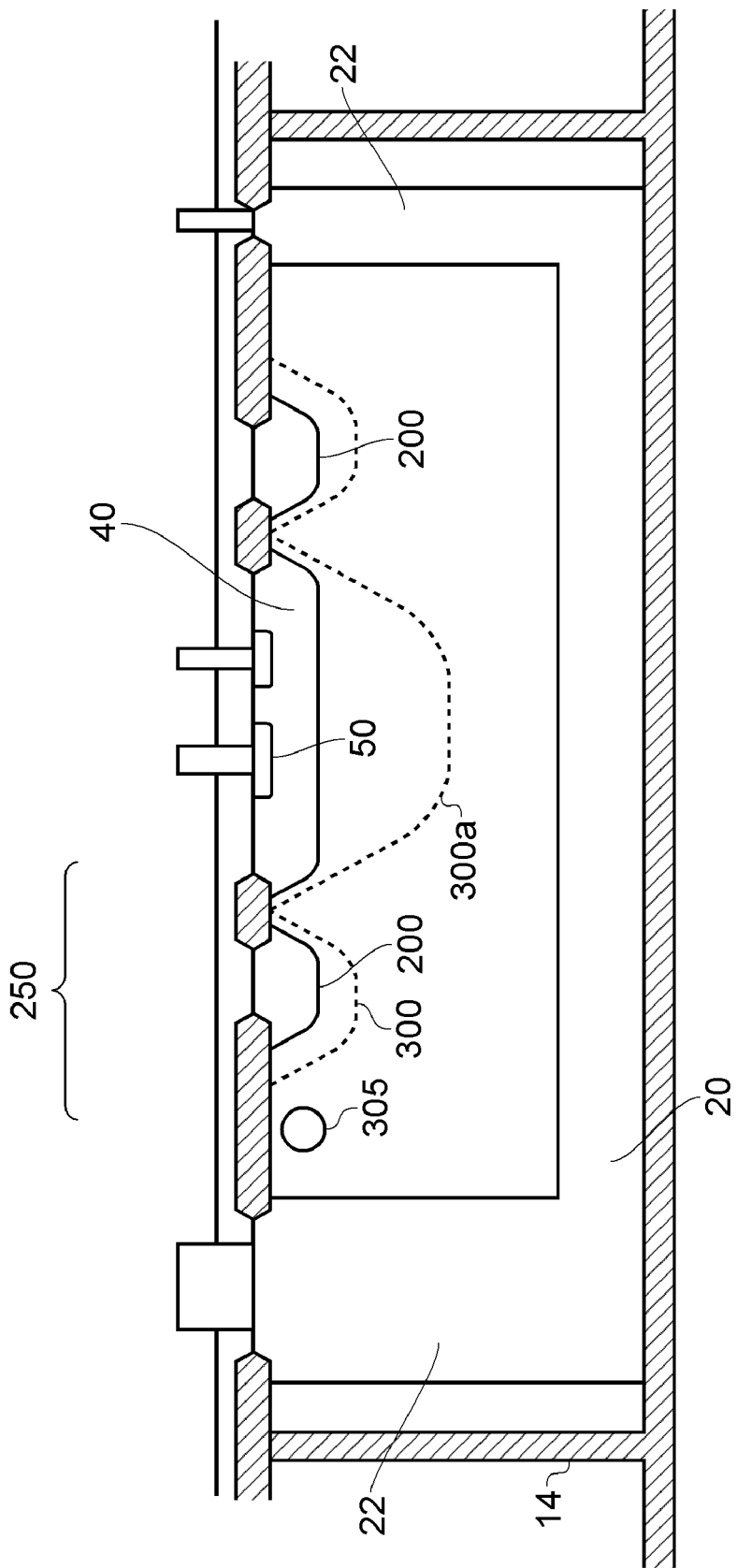
FIG. 10 shows the field potential within a transistor identical to that shown in FIG. 9, but not including field plates.

FIG. 10 schematically shows the field gradient for the same device as illustrated in FIG. 9, but with the field plate 290 omitted. FIG. 10 illustrates a region 305 that the boundary 300 has not extended into, compared to the equivalent device shown in FIG. 9. Thus the field gradient is higher around the edge of the guard region 200 in the device without the field plate 290 compared to the device having the field plate 290. This shows that the field plate has caused the depletion layer to spread in the transistor shown in FIG. 9.

Figure 11:
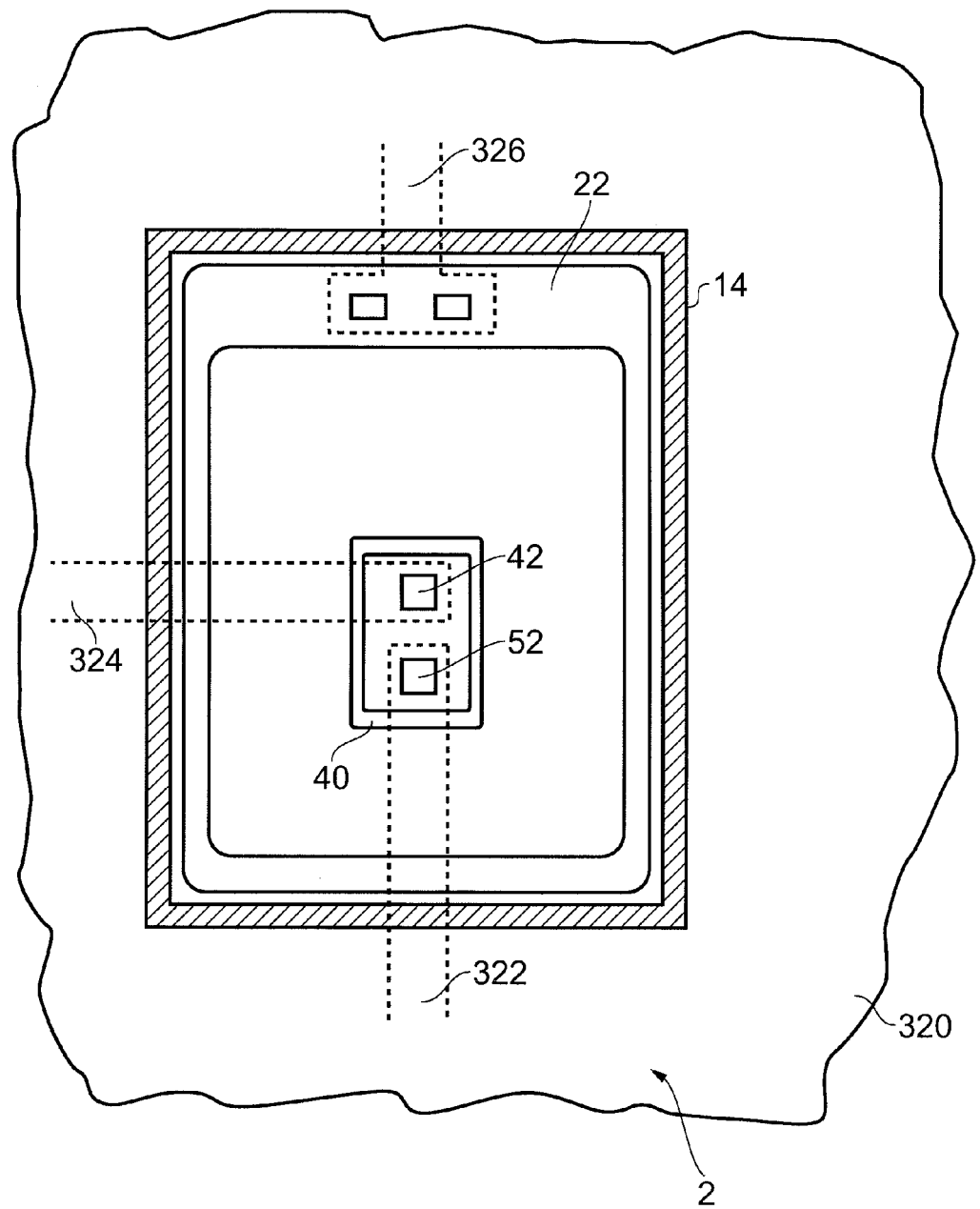
FIG. 11 is a plan view of a prior art transistor of FIG. 1.

FIG. 11 shows a plan view of the exemplary prior art transistor of FIG. 1. The transistor 2 is one of many formed in an integrated circuit 320. Metal tracks 322, 324 and 326 represent higher metallization patterns making interconnections to the emitter, base and collector regions of the transistor and are shown in outline.

Figure 12:
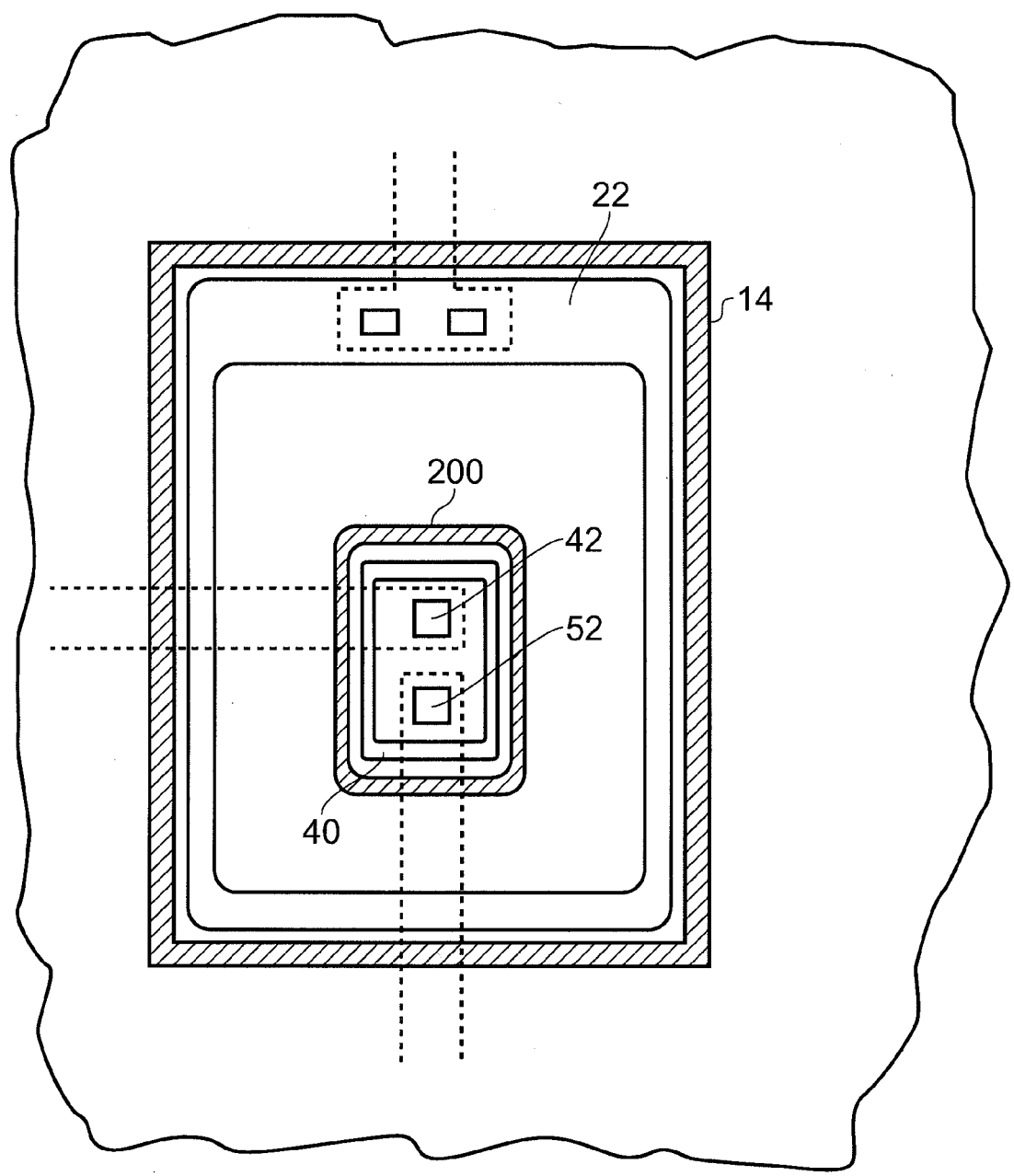
FIG. 12 is a plan view of a transistor in accordance an embodiment of the invention.

FIG. 12 shows how the device of FIG. 11 is modified by the inclusion of the guard region 200 spaced from and surrounding or encircling the base region 40 at the surface of the transistor. This modification enables the transistor 2 to be fabricated with an enhanced breakdown voltage, while not requiring any process changes beyond a modified mask. The guard region 200 can be implanted in the same processing step that implants the base 40. The field plate can be formed in the same metallization steps that form interconnections on the surface of the circuit. The field plate can also be used to ensure that the integrated circuit manufacturer does not lay any other conductors whose voltage is not known over critical junctions within the transistor. This may avoid further unknown electric fields being induced in the transistor.

It is thus possible to provide an improved transistor.
Applications

Transistors as described herein can be implemented in various electronic devices. Examples of the electronic devices can include high speed signal processing chips, power regulators, memory chips, memory modules, circuits of optical networks or other communication networks, and disk driver circuits. Products in which such electronics can be incorporated include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising a bipolar transistor, the bipolar transistor comprising a collector region, a base region, an emitter region, a floating guard region separated from and surrounding the base region, the floating guard region electrically separated from the base and collector regions, and a field isolation layer at least partially between the floating guard region and the base region, wherein the bipolar transistor is configured to form a depletion region around the edge of a PN junction formed between the base region and the collector region, and wherein the floating guard region is configured to extend the depletion region.

2. The apparatus of claim 1, wherein the field isolation layer is disposed at a surface of semiconductor material of the bipolar transistor.

3. An apparatus comprising a bipolar transistor, the bipolar transistor comprising a collector region, a base region, an emitter region, a floating guard region separated from and surrounding the base region, the floating guard region electrically separated from the base and collector regions, and a field isolation layer at least partially between the floating guard region and the base region, wherein the emitter region and the collector region have a first conductivity type, and the base region and the floating guard region have a second conductivity type, wherein the second conductivity type is opposite the first conductivity type.

4. The apparatus of claim 3, wherein the floating guard region and the base region have approximately the same maximum doping concentration.

5. An apparatus comprising a bipolar transistor, the bipolar transistor comprising a collector region, a base region, an emitter region, a guard region spaced from and surrounding the base region, the guard region having the same conductivity type as the base region, and a field isolation layer having a first edge abutting the guard region and a second edge abutting the base region, the field isolation layer configured to insulate at least a portion of the base region from the guard region, wherein the bipolar transistor is configured to form a depletion region around the edge of a PN junction formed between the base region and the collector region, and wherein the guard region is configured to spread out the depletion region.

6. The apparatus of claim 5, wherein the bipolar transistor is a vertical transistor with the collector region extending beneath the base region.

7. The apparatus of claim 6, wherein at least one connection region extends from the collector region to a surface of the bipolar transistor, the at least one connection region providing an electrical connection to the collector region at a surface of the bipolar transistor.

8. The apparatus of claim 7, wherein an other field isolation layer is configured to insulate at least a portion of the at least one connection region from the guard ring.

9. The apparatus of claim 5, wherein the guard region and the base region have approximately the same maximum doping concentration.

10. The apparatus of claim 5, further comprising an insulating layer disposed above the base region, the guard region, and the field isolation layer.

11. The apparatus of claim 5, wherein an edge of the guard region is separated by between approximately 4 µm and 6 µm from an edge of the base region.

12. The apparatus of claim 5, wherein the guard region is a guard ring that encircles the base region.

13. The apparatus of claim 5, further comprising a further region of semiconductor material intermediate the base region and the collector region, wherein the doping concentration of the further region is in a range from less heavily doped than the collector region, and wherein the field isolation layer is disposed above the further region and the collector is disposed below the further region.

14. The apparatus of claim 5, wherein the guard region is configured to float.

15. The apparatus of claim 5, wherein the guard region is not electrically connected to a contact.

16. The apparatus of claim 5, further comprising a field plate disposed above the guard region.

17. An apparatus comprising a bipolar transistor, the bipolar transistor comprising a collector region, a base region, an emitter region, and a floating guard region spaced apart from and surrounding the base region, wherein at least a portion of the base region is insulated from the guard region, and wherein an edge of the floating guard region is between approximately 3 µm and 7 µm from an edge of the base region.

18. The apparatus of claim 17, wherein the edge of the floating guard region is between approximately 4 µm and 6 µm from the edge of the base region.

19. The apparatus of claim 17, further comprising a field plate disposed above the floating guard region.

20. The apparatus of claim 17, wherein the field isolation layer has a first edge abutting the floating guard region and a second edge abutting the base region.

* * * * *